United States Patent
Liao et al.

(10) Patent No.: US 11,306,239 B2
(45) Date of Patent: Apr. 19, 2022

(54) HIGH THERMAL CONDUCTIVITY PREPREG AND USES OF THE SAME

(71) Applicant: TAIWAN UNION TECHNOLOGY CORPORATION, Chupei (TW)

(72) Inventors: Chih-Wei Liao, Chupei (TW); Chen-Hua Yu, Chupei (TW)

(73) Assignee: TAIWAN UNION TECHNOLOGY CORPORATION, Chupei (TW)

(*) Notice: Subject to any disclaimer, the term of this patent is extended or adjusted under 35 U.S.C. 154(b) by 407 days.

(21) Appl. No.: 16/359,825

(22) Filed: Mar. 20, 2019

(65) Prior Publication Data
US 2020/0172786 A1    Jun. 4, 2020

(30) Foreign Application Priority Data
Nov. 30, 2018  (TW) ................ 107142905

(51) Int. Cl.
| | |
|---|---|
| B32B 15/08 | (2006.01) |
| B32B 15/092 | (2006.01) |
| B32B 15/14 | (2006.01) |
| B32B 27/12 | (2006.01) |
| B32B 27/38 | (2006.01) |
| C08J 5/24 | (2006.01) |
| H05K 1/03 | (2006.01) |
| C09K 5/14 | (2006.01) |
| C08J 5/08 | (2006.01) |
| H05K 1/02 | (2006.01) |
| H05K 3/02 | (2006.01) |
| B32B 5/02 | (2006.01) |
| B32B 15/20 | (2006.01) |

(52) U.S. Cl.
CPC ............... *C09K 5/14* (2013.01); *B32B 5/024* (2013.01); *B32B 15/092* (2013.01); *B32B 15/20* (2013.01); *C08J 5/08* (2013.01); *C08J 5/24* (2013.01); *H05K 1/0204* (2013.01); *H05K 1/0366* (2013.01); *H05K 3/022* (2013.01); *B32B 2260/021* (2013.01); *B32B 2260/046* (2013.01); *B32B 2262/101* (2013.01); *B32B 2307/302* (2013.01); *B32B 2307/3065* (2013.01); *B32B 2457/08* (2013.01); *C08J 2363/00* (2013.01); *C08J 2371/12* (2013.01); *H05K 2201/012* (2013.01); *H05K 2203/0786* (2013.01)

(58) Field of Classification Search
None
See application file for complete search history.

(56) References Cited

U.S. PATENT DOCUMENTS

| | | | | |
|---|---|---|---|---|
| 4,603,157 A * | 7/1986 | Asai | ........................ | B29C 70/10 428/408 |
| 4,678,820 A * | 7/1987 | Pike | .......................... | C08J 5/06 264/136 |
| 4,783,345 A * | 11/1988 | Kleeberg | ........... | C08G 59/5086 427/97.1 |
| 4,882,370 A * | 11/1989 | Jordan | ....................... | C08J 5/04 523/215 |
| 4,935,265 A * | 6/1990 | Pike | ........................ | C03C 25/38 427/226 |
| 5,863,515 A * | 1/1999 | Davis | ...................... | C01B 37/00 423/628 |
| 2015/0189746 A1 | 7/2015 | Liao et al. | | |

FOREIGN PATENT DOCUMENTS

| | | |
|---|---|---|
| CN | 1970667 A | 5/2007 |
| CN | 104178822 | 12/2014 |
| CN | 105862395 A | 8/2016 |
| CN | 107805064 | 3/2018 |

OTHER PUBLICATIONS

Taiwanese Office Action from corresponding Taiwanese Patent Application No. 107142905, dated Mar. 31, 2020.

* cited by examiner

*Primary Examiner* — Michael J Feely
(74) *Attorney, Agent, or Firm* — Greer, Burns & Crain, Ltd

(57) ABSTRACT

A high thermal conductivity prepreg is provided. The high thermal conductivity prepreg includes a high thermal conductivity reinforcing material and a dielectric material layer formed on the surface of the high thermal conductivity reinforcing material, wherein the high thermal conductivity reinforcing material is prepared by a process which includes the following steps:
 (a) providing a precursor aqueous solution, the precursor aqueous solution includes a precursor selected from the group of organic salts, inorganic salts, and combinations thereof;
 (b) subjecting the precursor aqueous solution to a hydrolysis reaction to form an intermediate product aqueous solution;
 (c) subjecting the intermediate product aqueous solution to a condensation polymerization reaction to form a pretreatment solution;
 (d) impregnating a reinforcing material with the pretreatment solution; and
 (e) oven-drying the impregnated reinforcing material to obtain the high thermal conductivity reinforcing material.

20 Claims, No Drawings

HIGH THERMAL CONDUCTIVITY PREPREG AND USES OF THE SAME

CLAIM FOR PRIORITY

This application claims the benefit of Taiwan Patent Application No. 107142905 filed on Nov. 30, 2018, the subject matter of which is incorporated herein in its entirety by reference.

BACKGROUND

Field

A high thermal conductivity prepreg is provided, especially a prepreg comprising a pretreatmented high thermal conductivity reinforcing material. The high thermal conductivity prepreg of the present invention can further be used to manufacture a metal-clad laminate, and a printed circuit board.

Descriptions of the Related Art

In recent years, in the field of electronic telecommunications, electronic products need to have a smaller size, lighter weight and higher density due to the increasing amount of data transmission and the increasing speed of signal transmission. There are higher requirements on the physicochemical properties of the electronic materials used in such electronic products because the electronic products need to be miniature, lightweight and high-density, wherein the high density increases the heat energy generated per unit volume for the electronic products. In the case where the heat dissipation of the electronic material is poor, the components of such electronic products are heated for a long time, which accelerates deterioration, thereby, decreasing the stability and reliability of the electronic products. To meet the higher requirement for heat dissipation, electronic materials must have greater thermal conductivity.

In general, a meta-clad laminate is formed by alternately laminating a dielectric layer and a conductive layer, wherein the dielectric layer is usually prepared by attaching a resin composition to a reinforcing material, and the conductive layer is a metal foil. The conventional methods for increasing the thermal conductivity of electronic materials include using resins with better thermal conductivity, or increasing the amount of high thermal conductivity fillers in a resin composition to form a high thermal conductivity prepreg, wherein the high thermal conductivity fillers include but are not limited to aluminum nitride, boron nitride or alumina. However, a resin with better thermal conductivity not only is expensive, but also hits the limit in terms of improving thermal conductivity, such that it is still difficult to achieve the level of thermal conductivity needed for high-density electronic products; and a resin composition comprising a large amount of a high thermal conductivity filler is liable to cause deterioration of the adhesion between a prepreg prepared from a resin composition and a metal-clad laminate, and cause powder-dropping when the resin composition is prepared into a prepreg, which is disadvantageous for the preparation of electronic products.

CN 1970667 A discloses a preparation method for a thermal conductivity filler of $Al_2O_3/BN$ composite powder, wherein a BN-coated nano-$Al_2O_3$ powder is prepared by a sol-gel method. However, even if the conventional high thermal conductivity filler is replaced with a BN-coated nano-$Al_2O_3$ powder in a resin composition, the powder-dropping caused by a large amount of fillers cannot be avoided.

CN 105862395 A discloses a glass fiber cloth with a high thermal conductivity, which is prepared by impregnating a glass fiber cloth with a glue liquid containing a thermal conductivity filler (alumina and boron nitride), squeezing the impregnated glass fiber cloth with a squeeze roller, and then oven-drying the squeezed glass fiber cloth. However, the disadvantage thereof is that, due to being covered by the glue liquid, the high thermal conductivity filler cannot directly come into contact with the glass fiber cloth and be uniformly dispersed on the surface of the glass fiber cloth resulting in difficulty with improving the thermal conductivity of the glass fiber cloth.

Therefore, there is still a need for a reinforcing material with a high thermal conductivity and a high thermal conductivity prepreg prepared from the same.

SUMMARY

In view of the abovementioned technical problems, a high thermal conductivity prepreg is provided, wherein a pretreatment solution comprising a high thermal conductivity component is prepared by a sol-gel method, after which a reinforcing material is pretreated with the pretreatment solution so that the high thermal conductivity component is uniformly attached on the reinforcing material directly to form a high thermal conductivity reinforcing material, and a prepreg prepared from the same can have a high thermal conductivity and an excellent workability, and is suitable for the preparation of high-density electronic materials.

Accordingly, an objective of the present invention is to provide a high thermal conductivity prepreg, comprising a high thermal conductivity reinforcing material and a dielectric material layer formed on the surface of the high thermal conductivity reinforcing material, wherein the high thermal conductivity reinforcing material is prepared by a process comprising the following steps:

(a) providing a precursor aqueous solution, which comprises a precursor selected from the group consisting of an organic salt, an inorganic salt, and combinations thereof;

(b) subjecting the precursor aqueous solution to a hydrolysis reaction to form an intermediate product aqueous solution;

(c) subjecting the intermediate product aqueous solution to a condensation polymerization reaction to form a pretreatment solution;

(d) impregnating a reinforcing material with the pretreatment solution; and (e) oven-drying the impregnated reinforcing material to obtain the high thermal conductivity reinforcing material.

In some embodiments of the present invention, the organic salt is selected from the group consisting of aluminum methylate, aluminum ethylate, aluminum isopropylate, aluminum butylate, zinc acetate, and magnesium acetate.

In some embodiments of the present invention, the inorganic salt is zinc nitrate or aluminum nitrate.

In some embodiments of the present invention, the precursor is a combination of an organic salt and an inorganic salt, and the molar ratio of the organic salt to the inorganic salt is from 1:1 to 5:1.

In some embodiments of the present invention, the process, before step (c), further comprises a step of adding an additive into the intermediate product aqueous solution, wherein the additive is selected from the group consisting of sodium bis-2-ethylhexyl sulfosuccinate, sodium dodecyl benzene sulfonate, and combinations thereof.

In some embodiments of the present invention, the condensation polymerization reaction of step (c) is carried out at 20° C. to 90° C.

In some embodiments of the present invention, the oven-drying time of step (e) is 1 to 20 minutes, preferably 5 to 15 minutes and more preferably 5 to 10 minutes, and the oven-drying temperature of step (e) is 300° C. to 700° C., preferably 400° C. to 700° C., more preferably 400° C. to 600° C. and particularly preferably 450° C. to 550° C.

In some embodiments of the present invention, the reinforcing material is a glass fiber cloth, wherein the glass fiber cloth may be a woven fabric or a non-woven fabric, and the glass fiber cloth may be selected from the group consisting of an E-glass fiber cloth, an NE-glass fiber cloth, a Q-glass fiber cloth, a D-glass fiber cloth, an S-glass fiber cloth, a T-glass fiber cloth, and an L-glass fiber cloth.

In some embodiments of the present invention, the dielectric material layer is a cured product of a thermal-curable resin composition, wherein the thermal-curable resin composition comprises a thermal-curable resin and an optional hardener.

In some embodiments of the present invention, the thermal-curable resin composition further comprises at least one additive selected from the group consisting of a catalyst, a flame retardant, a filler, a dispersing agent, and a toughener.

Another objective of the present invention is to provide a metal-clad laminate, which is prepared by laminating the abovementioned high thermal conductivity prepreg and a metal foil.

Yet another objective of the present invention is to provide a printed circuit board, which is prepared from the abovementioned metal-clad laminate.

Yet another objective of the present invention is to provide a method for preparing a high thermal conductivity prepreg, comprising:

(a) providing a precursor aqueous solution, which comprises a precursor selected from the group consisting of an organic salt, an inorganic salt, and combinations thereof;

(b) subjecting the precursor aqueous solution to a hydrolysis reaction to form an intermediate product aqueous solution;

(c) subjecting the intermediate product aqueous solution to a condensation polymerization reaction to form a pretreatment solution;

(d) impregnating a reinforcing material with the pretreatment solution;

(e) oven-drying the impregnated reinforcing material to obtain a high thermal conductivity reinforcing material; and (f) forming a dielectric material layer on the surface of the high thermal conductivity reinforcing material, thereby obtaining a high thermal conductivity prepreg.

In some embodiments of the present invention, the organic salt is selected from the group consisting of aluminum methylate, aluminum ethylate, aluminum isopropylate, aluminum butylate, zinc acetate, and magnesium acetate.

In some embodiments of the present invention, the inorganic salt is zinc nitrate or aluminum nitrate.

In some embodiments of the present invention, the precursor is a combination of an organic salt and an inorganic salt, and the molar ratio of the organic salt to the inorganic salt is from 1:1 to 5:1.

In some embodiments of the present invention, the process, before step (c), further comprises a step of adding an additive into the intermediate product aqueous solution, wherein the additive is selected from the group consisting of sodium bis-2-ethylhexyl sulfosuccinate, sodium dodecyl benzene sulfonate, and combinations thereof.

In some embodiments of the present invention, the condensation polymerization reaction of step (c) is carried out at 20° C. to 90° C.

In some embodiments of the present invention, the oven-drying time of step (e) is 1 to 20 minutes, preferably 5 to 15 minutes and more preferably 5 to 10 minutes, and the oven-drying temperature of step (e) is 300° C. to 700° C., preferably 400° C. to 700° C., more preferably 400° C. to 600° C. and particularly preferably 450° C. to 550° C.

In some embodiments of the present invention, the reinforcing material is a glass fiber cloth, wherein the glass fiber cloth may be a woven fabric or a non-woven fabric, and the glass fiber cloth may be selected from the group consisting of an E-glass fiber cloth, an NE-glass fiber cloth, a Q-glass fiber cloth, a D-glass fiber cloth, an S-glass fiber cloth, a T-glass fiber cloth, and an L-glass fiber cloth.

To render the above objectives, technical features and advantages of the present invention more apparent, the present invention will be described in detail with reference to some embodiments hereinafter.

BRIEF DESCRIPTION OF THE DRAWINGS

Not applicable.

DETAILED DESCRIPTION

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing components in a solution, mixture or composition in the specification, the amount of each component is calculated based on the dry weight, i.e., regardless of the weight of the solvent.

Conventional high thermal conductivity prepregs are usually prepared from a resin composition into which a large amount of high thermal conductivity fillers is added. However, a large number of high thermal conductivity fillers are difficult to uniformly disperse in the resin composition, such that the prepared prepreg cannot have uniform thermal conductivity, and the high hardness of the fillers makes the workability of the prepared prepreg poor, and it is prone to powder-dropping during subsequent processing. Compared with the prior art, the feature of the present invention lies in that a pretreatment solution comprising a high thermal conductivity component is prepared by a sol-gel method and a reinforcing material is pretreated with the pretreatment solution so that the high thermal conductivity component is uniformly dispersed on the reinforcing material directly, thereby, preparing a prepreg with an excellent thermal conductivity and workability without powder-dropping. The detailed descriptions for each component of the high thermal conductivity prepreg and the uses of the same are provided as follows.

1. High Thermal Conductivity Prepreg

1.1. High Thermal Conductivity Reinforcing Material

The high thermal conductivity prepreg of the present invention comprises a high thermal conductivity reinforcing material and a dielectric material layer formed on the surface of the high thermal conductivity reinforcing material. The high thermal conductivity reinforcing material is prepared by utilizing a pretreatment solution comprising a high thermal conductivity component to pretreat a reinforcing material. In particular, the high thermal conductivity reinforcing material can be prepared by a process comprising the following steps:

(a) providing a precursor aqueous solution, which comprises a precursor selected from the group consisting of an organic salt, an inorganic salt, and combinations thereof;

(b) subjecting the precursor aqueous solution to a hydrolysis reaction to form an intermediate product aqueous solution;

(c) subjecting the intermediate product aqueous solution to a condensation polymerization reaction to form a pretreatment solution;

(d) impregnating a reinforcing material with the pretreatment solution; and (e) oven-drying the impregnated reinforcing material to obtain the high thermal conductivity reinforcing material.

1.1.1. Steps (a) to (c) for Preparing High Thermal Conductivity Reinforcing Material Steps (a) to (c) are related to the preparation of a pretreatment solution comprising a high thermal conductivity component, wherein the high thermal conductivity component is prepared by a sol-gel method and uniformly distributed in a pretreatment solution. As used herein, the sol-gel method is a wet chemistry reaction method, wherein a precursor is subjected to a hydrolysis reaction in an aqueous solution to form an intermediate product aqueous solution, the intermediate product aqueous solution is subjected to a condensation reaction to form an intermediate product aqueous solution containing uniformly dispersed fine colloidal particles (called "sol"), and then a part of the fine colloidal particles is polymerized and gelled to form a network-like colloid, thereby obtaining an aqueous solution containing a network-like colloid (called "gel"). Therefore, as used herein, a precursor refers to a substance which can be hydrolyzed and polymerized by a sol-gel method to form a high thermal conductivity component. The hydrolysate refers to the product of a hydrolysis reaction of the precursors. The pretreatment solution refers to an aqueous solution containing a network-like colloid (i.e., gel) prepared by a sol-gel method, and a high thermal conductivity component refers to a product obtained by subjecting an aqueous solution containing a network-like colloid to an oven-drying step.

Examples of the precursor include but are not limited to an organic salt, an inorganic salt, and combinations thereof. The organic salt includes but is not limited to metal alkoxide, metal carboxylate, metal sulfonate, and metal alkyl, such as aluminum methylate, aluminum ethylate, aluminum isopropylate, aluminum butylate, zinc acetate, and magnesium acetate. The inorganic salt includes but is not limited to metal nitrate, metal sulfate, metal carbonate, and metal chloride, such as zinc nitrate or aluminum nitrate. In some embodiments of the present invention, to prepare a high thermal conductivity component at nanometer scale, the precursor is a combination of organic salts and inorganic salts, such as a combination of aluminum methylate and aluminum nitrate, a combination of aluminum ethylate and aluminum nitrate, a combination of aluminum isopropylate and aluminum nitrate, a combination of aluminum butylate and aluminum nitrate, or a combination of zinc acetate and zinc nitrate. In the appended Examples, a combination of aluminum isopropylate and aluminum nitrate is used.

When the precursor is a combination of organic salts and inorganic salts, the molar ratio of the organic salt to the inorganic salt is from 1:1 to 5:1, preferably from 2:1 to 4:1, and more preferably from 2.5:1 to 3.5:1, such as 2.6:1, 2.7:1, 2.8:1, 2.9:1, 3:1, 3.1:1, 3.2:1, 3.3:1, or 3.4:1.

Taking a metal alkoxide as an example, the abovementioned sol-gel method involves the following reactions:

  reaction formula (1),

  reaction formula (2-1),

  reaction formula (2-2).

In the reaction formulas (1), (2-1) and (2-2), M represents a metal, R represents an alkyl group ($C_xH_{2x+1}$, wherein x is a positive integer), —OR represents an alkoxyl, and ROH represents an alcohol. In the reaction formula (1), the forward reaction from left to right is a hydrolysis reaction, wherein after the metal alkoxide is dissolved in water, the alkoxyl of the metal alkoxide is replaced with the hydroxyl of water to form a metal hydroxide and an alcohol. In the reaction formula (2-1), the forward reaction from left to right is a dehydration condensation reaction, wherein the dehydration condensation reaction is conducted by two metal hydroxides to form a metal oxide. In the reaction formula (2-2), the forward reaction from left to right is a dealcoholization condensation reaction, wherein the dealcoholization condensation reaction is conducted by a metal alkoxide and a metal hydroxide to form a metal oxide. In the sol-gel method, the condensation reaction is not carried out after the completion of the hydrolysis reaction, but starts to be carried out when M-OH is present in the aqueous solution. Therefore, in most of the reaction time, the condensation reaction is actually carried out simultaneously with the hydrolysis reaction.

In step (a), the precursor aqueous solution is obtained by dissolving or uniformly dispersing a precursor in a solvent. Examples of the solvent which can dissolve or uniformly disperse the precursor include but are not limited to water, alcohols, ethers, ketones, and hydrocarbons. Examples of the alcohol include but are not limited to methanol, ethanol, n-propanol, and isopropanol.

In step (b), the hydrolysis reaction can be carried out by stirring the precursor aqueous solution. The reaction time of the hydrolysis reaction is not particularly limited, and it can be adjusted by persons with ordinary skill in the art depending on the type of the precursor, and in general, may last between 1 hour and 120 hours, but the present invention is not limited thereto.

In step (c), the condensation polymerization reaction can be carried out by stirring the intermediate product aqueous solution. The temperature and reaction time of the step (c) are not particularly limited, and persons having ordinary skill in the art can adjust them depending on the type of the precursor. In general, the condensation polymerization reaction can be carried out at 20° C. to 90° C., such as 25° C., 30° C., 35° C., 40° C., 45° C., 50° C., 55° C., 60° C., 65° C., 70° C., 75° C., 80° C., or 85° C., and the reaction time of the condensation polymerization reaction can be from 1 hour to 60 hours, but the present invention is not limited thereto.

In addition, in some embodiments of the present invention, before step (c), an additive may be further added to the intermediate product aqueous solution to promote the condensation reaction and polymerization gelation of the intermediate product aqueous solution, thereby shortening the reaction time. Examples of the additive include but are not limited to a catalyst, a surfactant, and a chelating agent. In some embodiments of the present invention, a catalyst is added, wherein the catalyst is selected from the group consisting of sodium bis-2-ethylhexyl sulfosuccinate, sodium dodecyl benzene sulfonate, and combinations thereof.

1.1.2. Steps (d) to (e) for Preparing High Thermal Conductivity Reinforcing Material Steps (d) to (e) are used to prepare a high thermal conductivity reinforcing material by pretreating a reinforcing material with a pretreatment solution. Reinforcing materials include but are not limited to papers, cloths or mats made from materials selected from the group consisting of paper fibers, glass fibers, quartz fibers, organic polymeric fibers, carbon fibers, and combinations thereof. Examples of the organic polymeric fibers include but are not limited to a high-modulus polypropylene (HMPP) fiber, a polyamide fiber, an ultra-high molecular weight polyethylene (UHMWPE) fiber, and a liquid crystal polymer (LCP). In some embodiments of the present invention, a glass fiber cloth is used as a reinforcing material, such as an E-glass fiber cloth, an NE-glass fiber cloth, a Q-glass fiber cloth, a D-glass fiber cloth, an S-glass fiber cloth, a T-glass fiber cloth, and an L-glass fiber cloth, and the glass fiber cloth may be a woven fabric or non-woven fabric. In the appended Examples, E-glass fiber cloth is used as a reinforcing material.

In step (d), the way in which the reinforcing material is impregnated with the pretreatment solution is not particularly limited. For example, the reinforcing material may be impregnated with the pretreatment solution through horizontal immersion or vertical immersion, and the impregnation time is not particularly limited as long as it is long enough to make the entire reinforcing material uniformly coated with the pretreatment solution, such as from 1 minute to 5 minutes.

In step (e), the oven-drying refers to the placement of the impregnated reinforcing material in an oven and baking at a high temperature for a period of time to remove the solvent. A suitable oven-drying time can be from 1 to 20 minutes, preferably from 5 to 15 minutes, and more preferably from 5 to 10 minutes. The suitable oven-drying temperature can be from 300° C. to 700° C., preferably from 400° C. to 700° C., more preferably from 400° C. to 600° C., and particularly preferably from 450° C. to 550° C.

1.2. Dielectric Material Layer

In the high thermal conductivity prepreg of the present invention, the dielectric material layer is a cured product of a thermal-curable resin composition, wherein the thermal-curable resin composition comprises a thermal-curable resin, an optional hardener and an optional additive. The detailed descriptions for each component of the thermal-curable resin composition are provided as follows.

1.2.1. Thermal-Curable Resin

As used herein, a thermal-curable resin refers to a component which is gradually cured after being heated to form a network structure through a crosslinking reaction. The thermal-curable resin can be a single thermal-curable resin or a mixture of several thermal-curable resins. Examples of the thermal-curable resin include but are not limited to an epoxy resin and thermosetting phenolic resin with reactive functional groups, a thermosetting benzoxazine resin (hereinafter called "BZ resin"), a thermosetting polyphenylene ether resin, etc. Each of the thermal-curable resins can either be used alone or in any combination. As used herein, a reactive functional group refers to any functional group which can conduct a curing reaction, and the examples thereof include but are not limited to a hydroxyl group, a carboxyl group, an alkenyl group, and an amine group. In some embodiments of the present invention, an epoxy resin and thermosetting phenolic resin with reactive functional groups are used.

As used herein, an epoxy resin refers to a thermal-curable resin with at least two epoxy functional groups in each molecule, such as a bifunctional epoxy resin, a tetrafunctional epoxy resin, an octafunctional epoxy resin, or an epoxy resin with more than eight functional groups. The type of the epoxy resin is not particularly limited, and the epoxy resin can be used by persons having ordinary skill in the art depending on the need based on the disclosure of the present invention. For example, to impart the thermal-curable resin composition with better flame retardance, a bromine-containing epoxy resin is used, or when halogen-free environmental requirements are taken into consideration, a halogen-free epoxy resin (such as a bromine-free epoxy resin) can be used.

The epoxy resins which can be used in the present invention include are not limited to a dicyclopentadiene (DCPD-type) epoxy resin, a bisphenol epoxy resin, a phenolic epoxy resin, a diphenylethylene epoxy resin, a triazine skeleton-containing epoxy resin, a fluorene skeleton-containing epoxy resin, a triphenol methane epoxy resin, a xylylene epoxy resin, a biphenyl epoxy resin, a biphenyl aralkyl epoxy resin, a naphthalene epoxy resin, and an alicyclic epoxy resin. Examples of the bisphenol epoxy resin include are not limited to a bisphenol A epoxy resin, a bisphenol F epoxy resin or a bisphenol S epoxy resin. Examples of the phenolic epoxy resin include but are not limited to a phenol phenolic epoxy resin, a cresol phenolic epoxy resin, a bisphenol A phenolic epoxy resin or a bisphenol F phenolic epoxy resin. Examples of the epoxy resin may further include diglycidyl ether compounds of polyfunctional phenols and polycyclic aromatics, such as anthracene. Furthermore, phosphorus may be introduced into the epoxy resin to provide a phosphorus-containing epoxy resin. An example of the phosphorus-containing epoxy resin is a DOPO-modified epoxy resin, wherein DOPO is 9,10-dihydro-9-oxa-10-phosphahenanthrene-10-oxide. Examples of the bromine-containing epoxy resin include but are limited to a tetrabromobisphenol A epoxy resin.

Each of the epoxy resins can either be used alone or in any combination, which persons having the ordinary skill in the art may adjust depending on the practical needs. In the appended Examples, phenolic epoxy resin is used.

As used herein, a thermosetting polyphenylene ether resin with reactive functional groups refers to a resin with at least a repeating unit

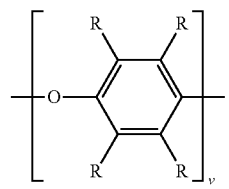

in the main chain and a reactive functional group at the terminal, wherein Rs are independently H or a C1-C5 alkyl, and v is an integer ranging from 1 to 100. Examples of the thermosetting polyphenylene ether resin with reactive functional groups include but are not limited to a hydroxyl-containing thermosetting polyphenylene ether resin, a vinyl-containing thermosetting polyphenylene ether resin, an allyl-containing thermosetting polyphenylene ether resin, a vinyl benzyl-containing thermosetting polyphenylene ether resin, an acryloyl-containing thermosetting polyphenylene ether resin, an acrylic group-containing thermosetting polyphenylene ether resin, and a methacrylic group-containing thermosetting polyphenylene ether resin. Each of the thermosetting polyphenylene ether resin with reactive functional groups can either be used alone or in any combination.

Examples of commercially-available thermosetting polyphenylene ether resins having reactive functional groups include OPE-2st (a vinyl benzyl-containing thermosetting polyphenylene ether resin) available from MITSUBISHI GAS CHEMICAL company, and SA-9000 (a methacrylic group-containing thermosetting polyphenylene ether resin) and SA-90 (a hydroxyl-containing thermosetting polyphenylene ether resin) available from SABIC company. In the appended Examples, methacrylic group-containing thermosetting polyphenylene ether resin is used.

In general, based on the dry weight of the thermal-curable resin composition, the content of the thermal-curable resin may range from 20 wt % to 85 wt %, but is not limited thereto. Persons having ordinary skill in the art can adjust the amount of the thermal-curable resin depending on the practical needs.

1.2.2. Hardener (Optional Component)

The thermal-curable resin composition may further be added with a hardener to promote the curing reaction. Taking a thermal-curable resin composition comprising an epoxy resin as an example, an additive is further added thereto, which can promote the ring-opening reaction of epoxy functional groups and lower the curing reaction temperature. The type of the hardener is not particularly limited as long as it can promote the ring-opening reaction of epoxy functional groups.

In the case of a thermal-curable resin composition comprising an epoxy resin, the suitable hardener include but are not limited to an OH group-containing compound, an amine-containing compound, an acid anhydride compound, and an active ester compound, wherein each mentioned hardener can either be used alone or in combination. Examples of the abovementioned hardener include but are not limited to a phenolic resin (PN resin), a styrene maleic anhydride copolymer (SMA copolymer), bismaleimide (BMI), dicyandiamide (Dicy), 4,4'-di aminodiphenyl sulfone (DDS), dianilinomethane, an aromatic diamine, an aromatic dianhydride, an aliphatic dianhydride, a triazine, a cyanate ester resin (CE), a phenolic triazine resin, a BZ resin and a ring-opening polymer thereof, and a copolymer of styrene and vinylphenol. In the appended Examples, Dicy is used.

In the case of a thermal-curable resin composition comprising a polyphenylene ether resin, examples of the hardener include but are not limited to BMI, a butadiene and/or styrene-containing elastomer, a vinyl and/or allyl-containing isocyanurate, and combinations thereof. In the appended Examples, vinyl and/or allyl-containing isocyanurate is used.

In general, based on the dry weight of the thermal-curable resin composition, the content of the hardener may range from 5 wt % to 25 wt %, but is not limited thereto. Persons having ordinary skill in the art can adjust the amount of the hardener depending on the practical needs.

1.2.3. Additive (Optional Component)

Besides the thermal-curable resin and hardener, the thermal-curable resin composition may further optionally comprise other additives to adaptively improve the workability of the thermal-curable resin composition in the manufacturing process, or to improve the physicochemical properties of the prepared electronic materials. Examples of the additive include but are not limited to a catalyst, a flame retardant and a filler, as described below and other additives well-known to persons having ordinary skill in the art such as a dispersing agent, a toughener, etc. Each of the additives can be used alone or in any combination depending on the need.

[Catalyst]

As used herein, a catalyst refers to a component which can promote a curing reaction. Common catalysts include but are not limited to organic peroxides, tertiary amines, quaternary ammonium salts, imidazole compounds, and pyridine compounds. Examples of the organic peroxide include but are not limited to benzoyl peroxide (BPO), dicumyl peroxide (DCP) and $\alpha,\alpha'$-bis(t-butylperoxy)diisopropyl benzene. Examples of the tertiary amine include but are not limited to dimethylbenzylamine, 2-dimethylaminomethylphenol, and 2,4,6-tris(dimethylaminomethyl)phenol. Examples of the imidazole compound include but are not limited to 2-methylimidazole, 2-ethyl-4-methyl imidazole, and 2-phenylimidazole. Examples of the pyridine compound include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. Each of the catalysts can be used alone or in any combination.

When the thermal-curable resin composition comprises an epoxy resin, the catalyst is preferably selected from tertiary amines, quaternary ammonium salts, imidazole compounds, or pyridine compounds. Furthermore, when the thermal-curable resin composition comprises a polyphenylene ether resin, the catalyst is preferably selected from organic peroxides. In the appended Examples, 2-methylimidazole or $\alpha,\alpha'$-bis(t-butylperoxy)diisopropyl benzene is used. In general, based on the dry weight of the thermal-curable resin composition, the content of the catalyst may range from 0.01 wt % to 5 wt %, but is not limited thereto. Persons having ordinary skill in the art can adjust the amount of the catalyst depending on the practical needs.

[Flame Retardant]

A flame retardant can improve the flame retardance of prepared electronic materials. The types of flame retardants include but are not limited to a phosphorus-containing flame retardant, a bromine-containing flame retardant and a nitrogen-containing compound, and each type of flame retardants may be used alone or in any combination. Examples of the phosphorus-containing flame retardant include but are not limited to a phosphate ester, a phosphazene, an ammonium polyphosphate, a metal phosphinate, a melamine phosphate, and combinations thereof. Examples of the bromine-containing flame retardant include but are not limited to tetrabromobisphenol A, decabromodiphenyloxide, decabrominated diphenyl ethane, 1,2-bis(tribromophenyl) ethane, brominated epoxy oligomer, octabromotrimethylphenyl indane, bis(2,3-dibromopropyl ether), tris(tribromophenyl) triazine, brominated aliphatic hydrocarbon, and brominated aromatic hydrocarbon. Examples of the nitrogen-containing compound include but are not limited to melamine and derivatives thereof. One commercially-available phosphorus-containing flame retardant is Melapur 200, available from BASF company.

In general, based on the dry weight of the thermal-curable resin composition, the content of the flame retardant may range from 0 wt % to 30 wt %, but is not limited thereto. Persons having ordinary skill in the art can adjust the amount of the flame retardant depending on the practical needs.

[Filler]

The thermal-curable resin composition of the present invention may further comprise a filler to improve the mechanical strength, thermal conductivity and dimensional stability of the prepared electronic materials. Examples of the suitable filler include but are not limited to silicon dioxide (including hollow silicon dioxide), alumina, aluminum hydroxide, magnesium oxide, magnesium hydroxide, calcium carbonate, talc, clay, aluminum nitride, boron nitride, silicon aluminum carbide, silicon carbide, sodium carbonate, titanium dioxide, zinc oxide, zirconium oxide, quartz, diamond powder, diamond-like powder, graphite, graphene, calcined kaolin, pryan, mica, hydrotalcite, carbon nanotube, polytetrafluoroethylene (PTFE) powder, glass bead, hollow glass bead, ceramic whisker, nanosized inorganic powder, and combinations thereof.

In general, based on the dry weight of the thermal-curable resin composition, the content of the filler may range from 0 wt % to 40 wt %, but is not limited thereto. Persons having ordinary skill in the art can adjust the amount of the filler depending on the practical needs.

1.2.4. Preparation of Thermal-Curable Resin Composition

The thermal-curable resin composition may be prepared into a varnish for subsequent applications by evenly mixing the thermal-curable resin, the hardener and other optional components through a stirrer, and dissolving or dispersing the obtained mixture into a solvent. The solvent here can be any inert solvent that can dissolve or disperse the components of the thermal-curable resin composition of the present invention but does not react with the components of the thermal-curable resin composition. For example, the solvents that can dissolve or disperse the components of the thermal-curable resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). Each mentioned solvent can either be used alone or in combination. The amount of the solvent is not particularly limited as long as the components of the thermal-curable resin composition can be evenly dissolved or dispersed therein. In the appended Examples, methyl ethyl ketone is used as the solvent.

2. Method for Preparing a High Thermal Conductivity Prepreg

The present invention also provides a method for preparing a high thermal conductivity prepreg, which comprises the following steps:
(a) providing a precursor aqueous solution, which comprises a precursor selected from the group consisting of an organic salt, an inorganic salt, and combinations thereof;
(b) subjecting the precursor aqueous solution to a hydrolysis reaction to form an intermediate product aqueous solution;
(c) subjecting the intermediate product aqueous solution to a condensation polymerization reaction to form a pretreatment solution;
(d) impregnating a reinforcing material with the pretreatment solution;
(e) oven-drying the impregnated reinforcing material to obtain a high thermal conductivity reinforcing material; and
(f) forming a dielectric material layer on the surface of the high thermal conductivity reinforcing material, thereby obtaining a high thermal conductivity prepreg.

The descriptions for steps (a) to (e) including the precursor, hydrolysis reaction, condensation polymerization reaction, pretreatment solution, reinforcing material, dielectric material layer and so on are as provided above. In step (f), forming a dielectric material layer on the surface of the high thermal conductivity reinforcing material is carried out by the following steps: impregnating the high thermal conductivity reinforcing material with the thermal-curable resin composition, or coating or spray coating the abovementioned resin composition onto the high thermal conductivity reinforcing material, and drying the impregnated, coated or spray coated high thermal conductivity reinforcing material. The coating can be accomplished by any of the conventional methods, such as, but not limited to, roll coating, bar coating, gravure coating, spin coating, slot coating, and mold coating. The drying is carried out at 150° C. to 180° C. for 2 to 20 minutes, thereby forming a semi-cured (B-stage) high thermal conductivity prepreg. In the appended Examples, the drying is carried out at 175° C. for 2 to 15 minutes.

3. Metal-Clad Laminate and Printed Circuit Board

The present invention also provides a metal-clad laminate prepared from the abovementioned high thermal conductivity prepreg, which comprises a dielectric layer and a metal layer, wherein the dielectric layer is provided by the aforementioned high thermal conductivity prepreg. In particular, the metal-clad laminate of the present invention can be prepared by superimposing a plurality of the abovementioned high thermal conductivity prepregs, superimposing a metal foil (such as a copper foil) on at least one external surface of the dielectric layer composed of the superimposed high thermal conductivity prepregs to provide a superimposed object comprising the dielectric layer and metal layer, and then performing a hot-pressing operation onto the superimposed object to obtain the metal-clad laminate. The hot-pressing operation conditions were as follows: hot-pressing for 60 to 200 minutes under a pressure ranging from 5 kg/cm$^2$ to 15 kg/cm$^2$ at a temperature ranging from 180° C. to 220° C.

Furthermore, the metal-clad laminate can form a printed circuit board by further patterning the external metal foil thereof.

4. Examples 4.1. Testing Methods

The present invention is further illustrated by the embodiments hereinafter, wherein the testing instruments and methods are as follows:

[Peeling Strength Test]

The peeling strength refers to the bonding strength between the metal foil and hot-pressed laminated prepreg and is expressed as the force required to vertically peel clad copper foil with a width of ⅛ inch from the surface of the hot-pressed laminated prepreg. The unit of the peeling strength is pound per inch (1b/in).

[Glass Transition Temperature (Tg) Test]

The glass transition temperature (Tg) of the metal-clad laminate is measured by using a Differential Scanning calorimeter (DSC), wherein the measuring methods are the IPC-TM-650.2.4.24C and 25C testing method of the Institute for Interconnecting and Packaging Electronic Circuits (IPC).

[Thermal Conductivity]

The thermal conductivity of the metal-clad laminate is measured according to ASTM D5470. The unit of the thermal conductivity is watt per meter-kelvin (W/m·K).

[Dielectric Constant (Dk) Measurement]

The dielectric constant (Dk) of the high thermal conductivity prepreg (resin content (RC) being 53%) is measured according to IPC-TM-650 2.5.5.13 under an operating frequency of 10 GHz.

[Drill Wear Test]

The drill wear is tested by repeatedly drilling the metal-clad laminate by using a drill with a diameter of 0.3 mm for 2000 times, and then observing the wear of the drill top surface. Since the cutting edge (CE) of the drill is continuously in contact with the metal-clad laminate and worn, the cutting corner (CC) of the cutting edge (CE) will be worn. In this test, the wear percentage of drill is obtained by measuring the wear percentage of the cutting corner (CC).

[Powder-Dropping Test]

The powder-dropping is evaluated by cutting the high thermal conductivity prepreg with a cutting tool and visually observing whether there is any powder dropping. If no powder dropping is observed, the test result is recorded as "N", and if any powder dropping is observed, the test result is recorded as "Y".

4.2. Preparation of Pretreatment Solution

[Pretreatment Solution A]

18.7565 g aluminum nitrate nonahydrate (ALN, available from MERCK company) was dissolved in 100 ml of 99% pure water to prepare a 0.5 M aqueous solution of aluminum nitrate. Subsequently, 10.212 g aluminum isopropoxide (ALP, available from MERCK company) powder was slowly added to a 0.5 M aqueous solution of aluminum nitrate so that the molar ratio of aluminum isopropoxide to aluminum nitrate nonahydrate was 1:1. The resultant aqueous solution was stirred for 48 hours to conduct a hydrolysis reaction. After that, 1 gram of sodium bis-2-ethylhexyl sulfosuccinate (available from MERCK company) or sodium dodecyl benzene sulfonate (available from MERCK company) was added to the aqueous solution, stirred and allowed to react for 1 hour and heated to 60° C. When the mixture was observed to become a transparent gel, it was heated to 90° C. and allowed to react for 8 hours, thereby, preparing a pretreatment solution A.

[Pretreatment Solution B]

Pretreatment solution B was prepared by the same method as the preparation of pretreatment solution A, with the exception that the molar ratio of aluminum isopropoxide to aluminum nitrate nonahydrate was adjusted to be 3:1.

[Pretreatment Solution C]

Pretreatment solution C was prepared by the same method as the preparation of pretreatment solution A, with the exception that the molar ratio of aluminum isopropoxide to aluminum nitrate nonahydrate was adjusted to be 4:1.

[Pretreatment Solution D]

Pretreatment solution D was prepared by the same method as the preparation of pretreatment solution A, with the exception that the molar ratio of aluminum isopropoxide to aluminum nitrate nonahydrate was adjusted to be 5:1.

[Pretreatment Solution E]

53.2075 g magnesium acetate tetrahydrate (MAT, available from MERCK company) was dissolved in 150 ml of ethanol and stirred uniformly, followed by the addition of 150 ml of 1 M oxalic acid (OA, available from MERCK company), and then stirred continuously until a white colloid appeared, thereby, preparing a pretreatment solution E.

[Pretreatment Solution F]

59.498 g zinc nitrate hexahydrate (ZNH, available from MERCK company) was dissolved in 150 ml of distilled water, stirred at room temperature and then heated to 90° C. to react for 1 hour. Subsequently, the aqueous solution of zinc nitrate was added to 10 ml of ethylene glycol (available from First Chemical Manufacture company) and stirred for 2 hours, thereby, preparing a pretreatment solution F.

[Pretreatment Solution G]

Pretreatment liquid G was prepared by a non-sol-gel method, in which 20 g alumina powder (available from Sumitomo Chemical company), 0.2 g of silane coupling agent (model: KBM-903, available from Shin-Etsu Chemical company) and 100 ml of methanol solution (methanol:water=1:1) were mixed uniformly and stirred for 90 minutes, thereby, preparing a pretreatment solution G.

4.3. Preparation of High Thermal Conductivity Reinforcing Material

The high thermal conductivity reinforcing materials of Examples 1 to 22 and Comparative Example 5 were respectively prepared according to the treatment conditions shown in Table 1. The model of the used E-glass fiber cloth is TGFC 2116 with a thickness of 90 micrometers.

TABLE 1

Treatment conditions of high thermal conductivity reinforcing materials

| | Pretreatment solution | Reinforcing material | Oven-drying temperature (° C.) | Oven-drying time (minutes) |
|---|---|---|---|---|
| Example 1 | A | E-glass fiber cloth | 300 | 5 |
| Example 2 | B | E-glass fiber cloth | 300 | 5 |
| Example 3 | B | E-glass fiber cloth | 400 | 5 |
| Example 4 | B | E-glass fiber cloth | 500 | 5 |
| Example 5 | C | E-glass fiber cloth | 500 | 5 |
| Example 6 | B | E-glass fiber cloth | 600 | 5 |
| Example 7 | B | E-glass fiber cloth | 700 | 5 |
| Example 8 | D | E-glass fiber cloth | 700 | 5 |
| Example 9 | A | E-glass fiber cloth | 500 | 5 |
| Example 10 | B | E-glass fiber cloth | 400 | 1 |
| Example 11 | E | E-glass fiber cloth | 400 | 5 |
| Example 12 | F | E-glass fiber cloth | 400 | 5 |
| Example 13 | B | E-glass fiber cloth | 400 | 1 |
| Example 14 | B | E-glass fiber cloth | 400 | 5 |
| Example 15 | C | E-glass fiber cloth | 500 | 5 |
| Example 16 | B | E-glass fiber cloth | 400 | 10 |

TABLE 1-continued

Treatment conditions of high thermal conductivity reinforcing materials

| | Pretreatment solution | Reinforcing material | Oven-drying temperature (° C.) | Oven-drying time (minutes) |
|---|---|---|---|---|
| Example 17 | D | E-glass fiber cloth | 700 | 5 |
| Example 18 | B | E-glass fiber cloth | 400 | 10 |
| Example 19 | B | E-glass fiber cloth | 400 | 15 |
| Example 20 | B | E-glass fiber cloth | 400 | 15 |
| Example 21 | B | E-glass fiber cloth | 400 | 20 |
| Example 22 | B | E-glass fiber cloth | 400 | 20 |
| Comparative Example 5 | G | E-glass fiber cloth | 300 | 5 |

4.4. Preparation of Thermal-Curable Resin Composition

The thermal-curable resin compositions of Examples 1 to 22 were prepared according to the relative amounts of components shown in Table 2. In detail, the components were mixed at room temperature with a stirrer, and thereafter, methyl ethyl ketone (available from TRANS CHIEF CHEMICAL company) as a solvent was added thereinto. After stirring the resultant mixture at room temperature for 60 to 120 minutes, the thermal-curable resin compositions were obtained.

The thermal-curable resin compositions of Comparative Examples 1 to 5 were prepared according to the relative amounts of components shown in Table 3. In detail, the components were mixed at room temperature with a stirrer, and thereafter, methyl ethyl ketone as a solvent was added thereinto. After stirring the resultant mixture at room temperature for 60 to 120 minutes, the thermal-curable resin compositions were obtained.

The raw material information of each component in Table 2 and Table 3 is listed in Table 4.

TABLE 2

Relative amounts of components in the thermal-curable resin compositions provided in the Examples

| | | Epoxy resin | Polyphenylene ether resin | Hardener | | Catalyst | |
|---|---|---|---|---|---|---|---|
| Unit: Parts by weight | | BET 534 | SA9000 | Dicy | TAIC | 2MI | Perbutyl-P |
| Examples | 1 | 125 | | 25 | | 0.1 | |
| | 2 | 125 | | 25 | | 0.1 | |
| | 3 | 125 | | 25 | | 0.1 | |
| | 4 | 125 | | 25 | | 0.1 | |
| | 5 | 125 | | 25 | | 0.1 | |
| | 6 | 125 | | 25 | | 0.1 | |
| | 7 | 125 | | 25 | | 0.1 | |
| | 8 | 125 | | 25 | | 0.1 | |
| | 9 | | 100 | | 25 | | 0.1 |
| | 10 | | 100 | | 25 | | 0.1 |
| | 11 | 125 | | 25 | | 0.1 | |
| | 12 | 125 | | 25 | | 0.1 | |
| | 13 | 125 | | 25 | | 0.1 | |
| | 14 | | 100 | | 25 | | 0.1 |
| | 15 | | 100 | | 25 | | 0.1 |
| | 16 | | 100 | | 25 | | 0.1 |
| | 17 | | 100 | | 25 | | 0.1 |
| | 18 | 125 | | 25 | | 0.1 | |
| | 19 | | 100 | | 25 | | 0.1 |
| | 20 | 125 | | 25 | | 0.1 | |
| | 21 | | 100 | | 25 | | 0.1 |
| | 22 | 125 | | 25 | | 0.1 | |

TABLE 3

Relative amounts of components in the thermal-curable resin compositions provided in the Comparative Examples

| | | Epoxy resin | Polyphenylene ether resin | Hardener | | Catalyst | | Filler |
|---|---|---|---|---|---|---|---|---|
| Unit: Parts by weight | | BET 534 | SA9000 | Dicy | TAIC | 2MI | Perbutyl-P | Alumina powder |
| Comparative Examples | 1 | 125 | | 25 | | 0.1 | | 0 |
| | 2 | 125 | | 25 | | 0.1 | | 90 |
| | 3 | | 100 | | 25 | | 0.1 | 0 |
| | 4 | | 100 | | 25 | | 0.1 | 90 |
| | 5 | 125 | | 25 | | 0.1 | | 0 |

TABLE 4

Raw Material List of the thermal-curable resin compositions

| Model No./Name | Description |
|---|---|
| BET 534 | Phenolic epoxy resin, dry weight being 80%, available from Chang Chun (CCP) Company |
| SA9000 | Polyphenylene ether resin, available from SABIC Company |
| Dicy | Dicyandiamide, hardener, available from Degussa Company |
| TAIC | Triallyl isocyanurate, hardener, available from Evonik Company |
| 2MI | 2-methylimidazole, catalyst, available from Union Chemical Company |
| Perbutyl-P | α,α'-bis(t-butylperoxy)diisopropyl benzene, catalyst, available from NOF Company |
| Alumina powder | Filler, available from Sumitomo Chemical Company |

4.5. Preparation and Properties of High Thermal Conductivity Prepreg and Metal-Clad Laminate The high thermal conductivity prepregs and metal-clad laminates were respectively prepared by using the high thermal conductivity reinforcing materials and thermal-curable resin compositions of Examples 1 to 22. In detail, each of the high thermal conductivity reinforcing materials of Examples 1 to 22 was respectively impregnated with the corresponding thermal-curable resin compositions of Examples 1 to 22 by a roll coater at a controlled thickness. The impregnated high thermal conductivity reinforcing materials were then placed in an oven and dried at 175° C. for 2 to 15 minutes to produce high thermal conductivity prepregs of Examples 1 to 22 in a half-cured state (B-stage) (the resin content of the high thermal conductivity prepreg was 53%). Four pieces of the high thermal conductivity prepregs were superimposed and two sheets of copper foil (high temperature elongation (HTE) copper foil), each 0.5 oz., were respectively superimposed on both of the two external surfaces of the superimposed high thermal conductivity prepregs to provide a superimposed object. A hot-pressing operation was performed on each of the prepared objects, thereby preparing the metal-clad laminates of Examples 1 to 22. The hot-pressing conditions were as follows: heating to 200° C. to 220° C. at a heating rate of 3.0° C./min, and hot-pressing for 180 minutes under a full pressure of 15 kg/cm' (initial pressure was 8 kg/cm') at said temperature.

The prepregs and metal-clad laminates were respectively prepared by using the thermal-curable resin compositions of Comparative Examples 1 to 4. In detail, the glass fiber cloth (type: TGFC 2116; thickness: 90 μm) was impregnated with each of the thermal-curable resin compositions of Comparative Examples 1 to 4 by a roll coater at a controlled thickness. The impregnated glass fiber cloths were then placed in an oven and dried at 175° C. for 2 to 15 minutes to produce the prepregs of Comparative Examples 1 to 4 in a half-cured state (B-stage) (the resin content of the prepreg was 53%). Four pieces of the prepregs were superimposed and two sheets of copper foil (each 0.5 oz.) were respectively superimposed on both of the two external surfaces of the superimposed prepregs to provide a superimposed object. A hot-pressing operation was performed on each of the prepared objects, thereby preparing the metal-clad laminates of Comparative Examples 1 to 4. The hot-pressing conditions were as follows: heating to 200° C. to 220° C. at a heating rate of 3.0° C./min, and hot-pressing for 180 minutes under a full pressure of 15 kg/cm$^2$ (initial pressure was 8 kg/cm$^2$) at said temperature.

The high thermal conductivity prepreg and metal-clad laminate were respectively prepared by using the high thermal conductivity reinforcing material and thermal-curable resin composition of Comparative Example 5. In detail, the high thermal conductivity reinforcing material of Comparative Example 5 was impregnated with the thermal-curable resin composition of Comparative Example 5 by a roll coater at a controlled thickness. The impregnated high thermal conductivity reinforcing material was then placed in an oven and dried at 175° C. for 2 to 15 minutes to produce high thermal conductivity prepreg of Comparative Example 5 in a half-cured state (B-stage) (the resin content of the high thermal conductivity prepreg was 53%). Four pieces of the high thermal conductivity prepregs were superimposed and two sheets of HTE copper foil (each 0.5 oz.) were respectively superimposed on both of the two external surfaces of the superimposed high thermal conductivity prepregs to provide a superimposed object. A hot-pressing operation was performed on each of the prepared object, thereby, preparing the metal-clad laminate of Comparative Example 5. The hot-pressing conditions were as follows: heating to 200° C. to 220° C. at a heating rate of 3.0° C./min, and hot-pressing for 180 minutes under a full pressure of 15 kg/cm$^2$ (initial pressure was 8 kg/cm$^2$) at said temperature.

The properties of the prepregs and metal-clad laminates of Examples 1 to 22 and Comparative Examples 1 to 5, including Tg, peeling strength, thermal conductivity, Dk, drill wear, and powder-dropping, were measured according to the aforementioned testing methods. The results are tabulated in Tables 5 and 6.

TABLE 5

Properties of prepreg and metal-clad laminate of Examples

| | Unit | Peeling strength lb/in | Tg ° C. | Thermal conductivity W/m·K | Dk @10 GHz | Drill wear % | Powder-dropping |
|---|---|---|---|---|---|---|---|
| Examples | 1 | 8.1 | 131 | 0.55 | 4.58 | 29 | N |
| | 2 | 8.2 | 134 | 0.62 | 4.60 | 30 | N |
| | 3 | 8.3 | 135 | 0.65 | 4.61 | 30 | N |
| | 4 | 8.5 | 136 | 0.65 | 4.61 | 28 | N |
| | 5 | 8.0 | 135 | 0.62 | 4.63 | 29 | N |
| | 6 | 8.5 | 136 | 0.65 | 4.62 | 32 | N |
| | 7 | 8.5 | 137 | 0.65 | 4.61 | 33 | N |
| | 8 | 7.9 | 139 | 0.65 | 4.63 | 33 | N |
| | 9 | 3.9 | 154 | 0.41 | 2.97 | 40 | N |
| | 10 | 4.1 | 162 | 0.50 | 2.99 | 47 | N |

TABLE 5-continued

Properties of prepreg and metal-clad laminate of Examples

| Unit | | Peeling strength lb/in | Tg °C. | Thermal conductivity W/m·K | Dk @10 GHz | Drill wear % | Powder-dropping |
|---|---|---|---|---|---|---|---|
| | 11 | 8.2 | 134 | 0.64 | 4.61 | 30 | N |
| | 12 | 8.3 | 132 | 0.62 | 4.61 | 29 | N |
| | 13 | 8.4 | 135 | 0.57 | 4.60 | 29 | N |
| | 14 | 4.0 | 161 | 0.52 | 3.01 | 45 | N |
| | 15 | 3.9 | 162 | 0.53 | 3.02 | 46 | N |
| | 16 | 4.1 | 163 | 0.53 | 3.02 | 46 | N |
| | 17 | 3.2 | 166 | 0.54 | 3.00 | 51 | N |
| | 18 | 8.5 | 135 | 0.65 | 4.60 | 31 | N |
| | 19 | 4.1 | 162 | 0.52 | 3.01 | 47 | N |
| | 20 | 8.5 | 135 | 0.65 | 4.60 | 31 | N |
| | 21 | 4.1 | 160 | 0.53 | 3.00 | 48 | N |
| | 22 | 8.4 | 135 | 0.65 | 4.60 | 32 | N |

TABLE 6

Properties of prepreg and metal-clad laminate of Comparative Examples

| Unit | | Peeling strength lb/in | Tg °C. | Thermal conductivity W/m·K | Dk @10 GHz | Drill wear % | Powder-dropping |
|---|---|---|---|---|---|---|---|
| Comparative | 1 | 8.4 | 135 | 0.42 | 4.60 | 30 | N |
| Examples | 2 | 6.5 | 138 | 0.68 | 4.90 | 67 | Y |
| | 3 | 4.1 | 162 | 0.39 | 3.01 | 48 | N |
| | 4 | 3.2 | 166 | 0.52 | 3.90 | 64 | Y |
| | 5 | 7.2 | 136 | 0.51 | 4.60 | 50 | N |

As shown in Table 5, each of the electronic materials prepared from the high thermal conductivity prepregs of the present invention exhibits satisfactory mechanical properties and dielectric properties (e.g. Dk, peeling strength and so on), has excellent thermal conductivity and drill wear-resistance, and does not exhibit powder-dropping during processing. As shown in Examples 2, 3, 4, 6 and 7, in the case where the oven-drying temperature of the pretreatment solution is 400° C. to 600° C., while maintaining the other conditions, the peeling strength, thermal conductivity, Tg and drill wear-resistance of the prepared electronic material are better. Also, as shown in Examples 3, 13, 18, 20 and 22, and Examples 10, 14, 16, 19 and 21, in the case where the oven-drying time of the pretreatment solution ranges from 5 to 15 minutes, while maintaining the other conditions, the thermal conductivity and drill wear-resistance of the prepared electronic material can have a better balance. In addition, as shown in Examples 3, 11 and 12, under the condition that the precursor is the specified salt, a pretreatment solution comprising a high thermal conductivity component can be prepared, and the prepared electronic materials can have high thermal conductivity.

In contrast, as shown in Table 6, electronic materials prepared by using high thermal conductivity prepregs other than that of the present invention do not have outstanding thermal conductivity and drill wear-resistance at the same time, and powder-dropping appears during processing. Specifically, as shown in Comparative Examples 1 and 3, in the case where the high thermal conductivity prepreg of the present invention is not used and the thermal-curable resin composition excludes fillers, the thermal conductivities of the prepared electronic materials are lower, wherein the thermal conductivity of the electronic material prepared from the thermal-curable resin composition comprising an epoxy resin is only 0.42 W/m·K, while the thermal conductivity of the electronic material prepared from the thermal-curable resin composition comprising an polyphenylene ether resin is only 0.39 W/m·K. Also, as shown in Comparative Examples 2 and 4, in the case where the high thermal conductivity prepreg of the present invention is not used and the thermal-curable resin composition includes fillers, powder-dropping appears during processing and the drill wear percentage is high (i.e., the drill wear-resistance is poor) although the prepared electronic material may have a higher thermal conductivity. Furthermore, as shown in Comparative Example 5, in the case of using a conventional high thermal conductivity prepreg prepared by the sol-gel method not specified by the present invention, the thermal conductivity of the prepared electronic material is still significantly lower than that of the electronic material prepared by using the high thermal conductivity prepreg of the present invention, which indicates that the sol-gel method specified in the present invention imparts the characteristics of the high thermal conductivity prepreg of the present invention, which differs from that of the high thermal prepreg prepared in accordance with other methods.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A high thermal conductivity prepreg, comprising a pretreated reinforcing material and a dielectric material layer formed on a surface of the pretreated reinforcing material; wherein the pretreated reinforcing material comprises a reinforcing material and a high thermal conductivity material; and wherein the pretreated reinforcing material is prepared by a process which comprises the following steps:
   (a) providing an aqueous solution comprising a precursor of a high thermal conductivity component, wherein the precursor of the high thermal conductivity component is a combination of an organic salt and an inorganic salt;
   (b) subjecting the aqueous solution to a hydrolysis reaction;
   (c) subjecting the hydrolyzed aqueous solution to a condensation polymerization reaction to form a pretreatment solution comprising the high thermal conductivity component;
   (d) impregnating the reinforcing material with the pretreatment solution; and
   (e) oven-drying the impregnated reinforcing material to obtain the pretreated reinforcing material comprising the reinforcing material and the high thermal conductivity material.

2. The high thermal conductivity prepreg of claim 1, wherein the organic salt is selected from the group consisting of aluminum methylate, aluminum ethylate, aluminum isopropylate, aluminum butylate, zinc acetate, and magnesium acetate.

3. The high thermal conductivity prepreg of claim 1, wherein the inorganic salt is zinc nitrate or aluminum nitrate.

4. The high thermal conductivity prepreg of claim 1, wherein the organic salt and the inorganic salt are provided in a molar ratio of from 1:1 to 5:1.

5. The high thermal conductivity prepreg of claim 1, wherein the process, before step (c), further comprises a step of adding an additive to the hydrolyzed aqueous solution, and the additive is selected from the group consisting of sodium bis-2-ethylhexyl sulfosuccinate, sodium dodecyl benzene sulfonate, and combinations thereof.

6. The high thermal conductivity prepreg of claim 1, wherein the condensation polymerization reaction of step (c) is carried out at 20° C. to 90° C.

7. The high thermal conductivity prepreg of claim 1, wherein the oven-drying of step (e) is carried out at 300° C. to 700° C. for 1 to 20 minutes.

8. The high thermal conductivity prepreg of claim 1, wherein the reinforcing material is a glass fiber cloth.

9. The high thermal conductivity prepreg of claim 1, wherein the dielectric material layer is a cured product of a thermal-curable resin composition, wherein the thermal-curable resin composition comprises a thermal-curable resin and an optional hardener.

10. The high thermal conductivity prepreg of claim 9, wherein the thermal-curable resin composition further comprises at least one selected from the group consisting of a catalyst, a flame retardant, a filler, a dispersing agent, and a toughener.

11. A metal-clad laminate, which is prepared by laminating the high thermal conductivity prepreg of claim 1 and a metal foil.

12. A printed circuit board, which is prepared from the metal-clad laminate of claim 11.

13. A method for preparing the high thermal conductivity prepreg of claim 1, comprising: preparing the pretreated reinforcing material according to the process comprising steps (a), (b), (c), (d), and (e); and
   (f) forming the dielectric material layer on a surface of the pretreated reinforcing material, thereby obtaining the high thermal conductivity prepreg.

14. The method of claim 13, wherein the organic salt is selected from the group consisting of aluminum methylate, aluminum ethylate, aluminum isopropylate, aluminum butylate, zinc acetate, and magnesium acetate.

15. The method of claim 13, wherein the inorganic salt is zinc nitrate or aluminum nitrate.

16. The method of claim 13, wherein the organic salt and the inorganic salt are provided in a molar ratio of from 1:1 to 5:1.

17. The method of claim 13, further comprising, before step (c), a step of adding an additive to the hydrolyzed aqueous solution, and the additive is selected from the group consisting of sodium bis-2-ethylhexyl sulfosuccinate, sodium dodecyl benzene sulfonate, and combinations thereof.

18. The method of claim 13, wherein the condensation polymerization reaction of step (c) is carried out at 20° C. to 90° C.

19. The method of claim 13, wherein the oven-drying of step (e) is carried out at 300° C. to 700° C. for 1 to 20 minutes.

20. The method of claim 13, wherein the reinforcing material is a glass fiber cloth.

* * * * *